(12) United States Patent
Li et al.

(10) Patent No.: US 6,327,035 B1
(45) Date of Patent: Dec. 4, 2001

(54) METHOD AND APPARATUS FOR OPTICALLY EXAMINING MINIATURE PATTERNS

(75) Inventors: Guoguang Li, San Jose; Dale A. Harrison, Tracy; Abdul Rahim Forouhi, Cupertino, all of CA (US)

(73) Assignee: NSH Technology, Inc., Santa Clara, CA (US)

( * ) Notice: Subject to any disclaimer, the term of this patent is extended or adjusted under 35 U.S.C. 154(b) by 0 days.

(21) Appl. No.: 09/451,465

(22) Filed: Nov. 30, 1999

(51) Int. Cl.[7] .......................... G01N 21/00; G01N 21/55; G01B 11/06; G01J 5/02
(52) U.S. Cl. .......................... 356/432; 356/445; 356/381; 356/382; 250/341.8
(58) Field of Search .................... 250/341.8; 356/432, 356/381–382, 445

(56) References Cited

U.S. PATENT DOCUMENTS

| | | | |
|---|---|---|---|
| 4,757,207 | 7/1988 | Chappelow et al. | 250/491.1 |
| 4,866,782 | 9/1989 | Sugie et al. | 382/22 |
| 5,184,021 | 2/1993 | Smith | 250/560 |
| 5,363,171 | 11/1994 | Mack | 355/68 |
| 5,607,800 | 3/1997 | Ziger | 430/8 |
| 6,100,985 | 8/2000 | Scheiner et al. | 356/381 |

Primary Examiner—Frank G. Font
Assistant Examiner—Amanda Merlino
(74) Attorney, Agent, or Firm—Lumen Intellectual Property Services, Inc.

(57) ABSTRACT

A method and apparatus for optically determining a physical parameter a pattern made up of features and disposed on an underlayer. The physical parameter can be, e.g., feature width, relative feature size, feature thickness, index of refraction n or extinction coefficient k and is determined from a response light generated upon illumination of the pattern and underlayer. The response light, e.g. light transmitted by or reflected from the pattern and from the underlayer is analyzed and broken down into response light fractions including an underlayer light fraction and a feature light fraction as well as any other background light fractions making up the response light. The physical parameter of the pattern is determined from the response light fractions and reference physical parameters) of the underlayer, which are either known a priori or determined.

26 Claims, 5 Drawing Sheets

METHOD AND APPARATUS FOR OPTICALLY EXAMINING MINIATURE PATTERNS

FIELD OF THE INVENTION

This invention relates generally to methods and apparatus for optically examining structures with patterns having features such as surface features or embedded features.

BACKGROUND OF THE INVENTION

In the production of miniaturized objects, e.g., miniature devices e.g., integrated circuits and microelectronics for semiconductor and display applications, the tools and auxiliary structures used in their manufacture, as well as the miniaturized objects themselves have to be examined carefully. Optical methods of examining these tools, objects and structures are non-destructive and frequently preferred over other approaches. Hence, advances in optical examination of miniature patterns or features are important.

In many cases miniaturized devices are made by photolithographic techniques. In a typical application of the photolithographic technique, a layer of photoresist is deposited on a substrate or other device layer and then exposed to radiation of appropriate wavelength through a patterning mask. Certain regions of the photoresist layer are exposed, and other are not, according to the pattern defined in the mask. Exposing the photoresist to radiation changes its solubility. After exposure, solvent is used to remove regions of higher solubility photoresist, leaving regions of "hardened" photoresist at sites on the device layer as dictated by the patterning mask. The "hardened" photoresist remains to protect the underlying material from removal during a subsequent etching step or other suitable material removal procedure. After etching the photoresist is discarded. In this manner, a feature is created in the device based on the pattern defined in the mask.

Clearly, the photoresist layer must be accurately patterned to form features to the exacting specifications for miniature devices. It is therefore desirable to monitor the photolithographic process at various stages and on a periodic basis. For example, it would be desirable to measure the thickness of the photoresist layer and examine the pattern to determine feature sizes. This may be done by subjecting the photoresist to ultraviolet light having a wavelength in the range of 300 to 800 nm and measuring the reflected radiation. The reflected radiation may be correlated to photoresist thickness. The general principle of this measurement technique is that the measured light reflected from a substrate is modulated by constructive and destructive optical interference from an overlying semitransparent material such as photoresist. For more information see Chopra, K. L., *Thin Film Phenomena*, p. 99 (McGraw Hill, 1969). The periodicity of the reflectance spectra can also be used to determine optical properties, such as the refractive index n of the substrate.

Measurement of the pattern or features is a more difficult procedure. For example, in a typical application, the pattern consists of a plurality of stripes and spaces, e.g. a line and space pattern. These types of patterns are frequently encountered in forming diffractive elements such as lenses or gratings in semiconductors or glass, forming fluid flow microchannels in silicon, and in general for providing a variety of mechanical features in a substrate. In measuring stripe widths and separations the prior art techniques have typically relied on scanning electron microscopy (SEM).

The prior art also offers interferometric techniques for measuring repeating patterns. These can be used to examine highly regular patterns such as gratings.

More recently, attempts have been made to measure patterns using scatterometry. In this technique, a pattern is subjected to light, such as from a laser, typically having a single wavelength. The light is usually directed toward the pattern at some angle to the normal. The light reflected from the pattern is reflected at various orders, i.e., angles relative to the incident light. The amount or intensity of light reflected at various orders is measured. It may be possible to use such data to obtain quantitative information about the pattern. However, scatterometry is very sensitive to changes in the profile of the pattern, i.e., the height of lines, and requires relatively sophisticated correlation work to relate the reflected radiation to the features of a pattern. Other examples of characterization methods pertaining to photolithography and equipment suitable for practicing such methods are described in U.S. Pat. Nos. 5,363,171; 5,184,021; 4,866,782 and 4,757,207.

Another approach to measuring micro-sized patterns is discussed in U.S. Pat. No. 5,607,800 to Ziger. This method and arrangement for characterizing features of a patterned material on an underlayer is based on selecting an appropriate wavelength range where the patterned material absorbs more radiation than the underlayer. In other words, substrate or underlayer is more reflective than the pattern or surface features in this wavelength range. The reflectance spectrum uniquely identifies the pattern and can be used to study similar patterns by comparing their reflectance spectra. Unfortunately, just as in the case of scatterometry when patterns vary this comparison-based approach can not be used effectively to study altered patterns.

In fact, all of the above approaches to optically measuring miniature patterns or features are limited in their applicability. What is needed is a more versatile approach to examining miniature patterns with varying feature sizes.

OBJECTS AND ADVANTAGES OF THE INVENTION

Accordingly, it is a primary object of the present invention to provide a method and an apparatus for optically examining patterns having various feature sizes. In particular, the method and apparatus of invention are to provide for measuring patterns exhibiting considerable feature variations and determining physical parameters of these patterns and features. These parameters include the thickness of the patterns and features as well as their coefficients n and k.

It is another object of the invention to provide for measuring patterns with surface features as well as embedded features.

Yet another object of the invention is to provide a method and apparatus for measuring the physical properties of patterns deposited on an underlayer and other physical properties of the sample of which the underlayer and deposited pattern are a part.

The above objects and advantages, as well as numerous other improvements attained by the method and apparatus of the invention are pointed out below.

SUMMARY

The objects and advantages of the invention are achieved by a method for optically determining a physical parameter of a pattern made up of features and disposed on an underlayer. The physical parameter can be, e.g., feature width, relative feature size, feature thickness, index of refraction n or extinction coefficient k.

In the absence of a priori knowledge about any of the sample's parameters the method is practiced by first illuminating the underlayer with a light beam to receive a reference light from the underlayer. A reference physical parameter of the underlayer is determined from the reference light. This reference parameter can be underlayer thickness, index of refraction n or extinction coefficient k. Preferably, reference thickness as well as n and k are determined.

A spot size is selected and the underlayer and at least a portion of the pattern are illuminated with the light beam over the selected spot size. The response light from the portion of the pattern and from the underlayer is analyzed and broken down into response light fractions. Typically, an underlayer light fraction, a feature light fraction as well as any other background light fractions make up the response light. The physical parameter of the pattern is determined from the response light fractions and the reference physical parameter.

In a preferred embodiment a second reference physical parameter is obtained from a patterning layer in which the pattern is made prior to the patterning step. Accordingly, the patterning layer and the underlayer are illuminated by the light beam and a second reference light from the underlayer and the patterning layer is examined to determine a second reference physical parameter. The second physical parameter can also be the thickness, or coefficients n or k, and preferably all of these parameters are determined.

The light beam spans a wavelength range $\alpha\lambda$ and the features making up the pattern have certain minimum feature sizes. Range $\Delta\lambda$ is chosen such that the longest wavelength the range contains is substantially smaller than this minimum feature size. Preferably, wavelength range $\Delta\lambda$ extends from ultra-violet to near infra-red. The spot size is also adjusted to be substantially larger than a relative feature size.

The response light is either reflected or transmitted. In case of reflected light the response light fractions are reflected light fractions and are computed in accordance with the following equations:

$$R_{tot}(\lambda) = \sum_{i=1}^{N} R_i(\lambda) \cdot X_i; \quad \sum_{i=1}^{N} X_i = 1$$

where $R_{tot}(\lambda)$ is the total reflected light at a wavelength $\lambda$ in range $\Delta\lambda$, and $R_i(\lambda) \cdot X_i$ correspond to the reflected light fractions, e.g., $R_N(\lambda) \cdot X_N$ is due to the N-th feature. The reflected light fractions include those from the features as well as those from the underlayer. When the response light is transmitted the transmitted light fractions are computed from:

$$T_{tot}(\lambda) = \sum_{i=1}^{N} T_i(\lambda) \cdot X_i; \quad \sum_{i=1}^{N} X_i = 1$$

where $T_{tot}(\lambda)$ is the total transmitted light at wavelength $\lambda$ and $T_i(\lambda) \cdot X_i$ correspond to transmitted light fractions.

In some embodiments the underlayer is disposed on a substrate. In this situation, in order obtain more accurate information about the pattern, it is advantageous to first illuminate the substrate with the light beam and study a third reference light either reflected or transmitted by the substrate. A third reference physical parameter characterizing the substrate (e.g., substrate thickness, coefficients n or k, or all of these parameters) can be obtained from this light and used in determining the physical parameter of the pattern.

The features making up the pattern can be very simple, e.g., straight lines, or more complicated. The features do not all have to be the same and they can be made of several feature sub-layers stacked on top of each other. Likewise, the underlayer can be made of several underlayer sub-layers. In most common applications, the pattern is produced by a photolithographic technique.

The method of the invention uses response light fractions produced by the structure made of the pattern (one or more features can be illuminated at a time), the underlayer and any other layers—e.g., substrate or top coat—in determining the physical parameters of the pattern features. Preferably, a dispersion model is used in such determinations.

An apparatus suitable for carrying out the method of invention requires an illumination source for providing the light beam for illuminating the underlayer and at least a portion of the pattern. A beam adjustment mechanism for adjusting the position of the beam spot and its size is used. A detector detects the response light and a computing unit in communication with the detector determines the response light fractions.

A detailed description of the invention and the preferred embodiment is presented below in reference to the attached drawing figures.

DETAILED DESCRIPTION

Figure 1:
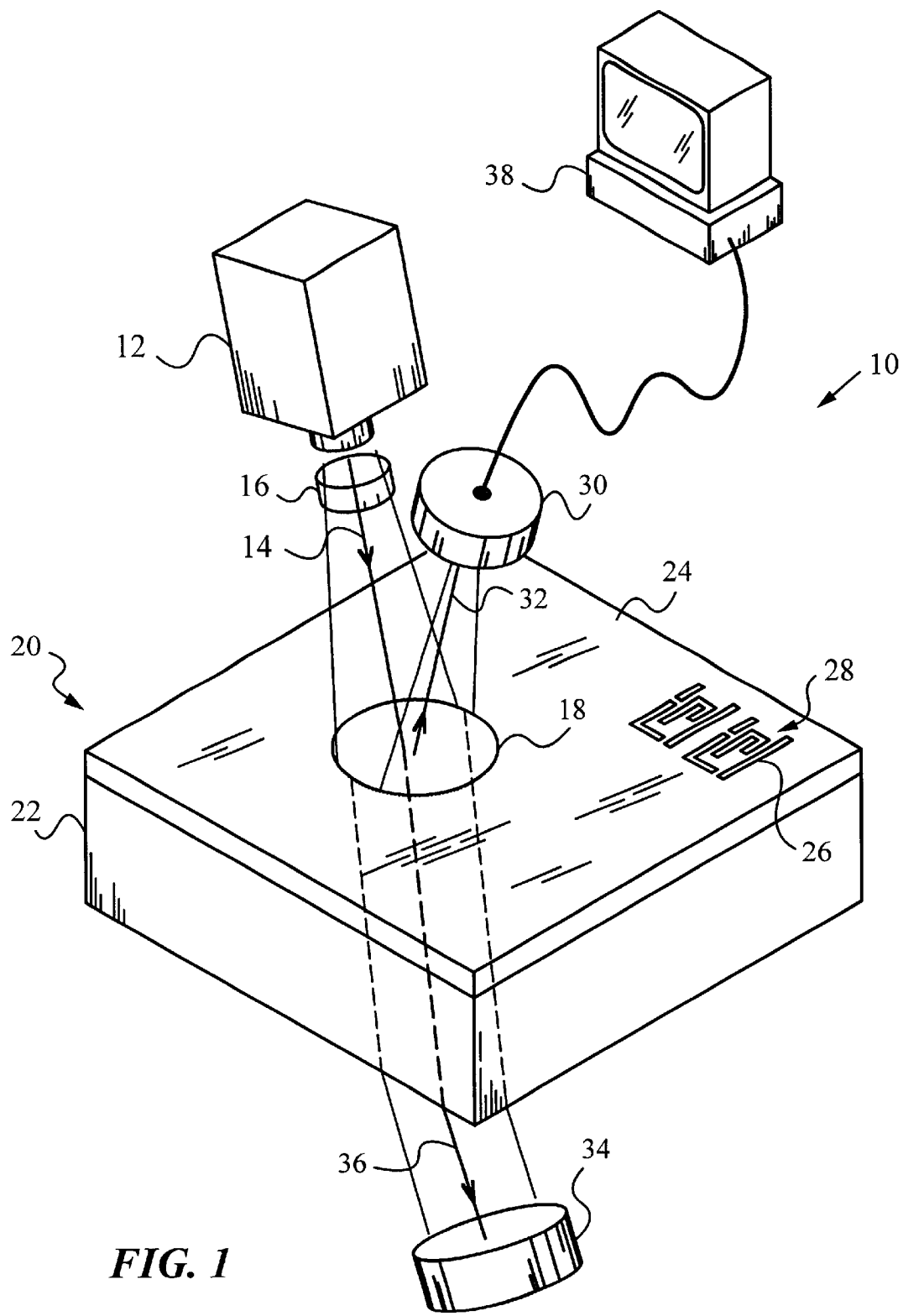
FIG. 1 is an isometric view of an apparatus according to the invention.

An apparatus 10 used to practice the method of the invention is shown in FIG. 1. The apparatus has a light source 12 which generates a light beam 14. Light source 12 can be a tunable laser or any other suitable light source or combination of light sources for producing light beam 14 spanning a wavelength range $\Delta\lambda$, e.g., from 190 nm to 1000 nm or from the ultra-violet to the near infra-red.

A beam adjustment mechanism 16 such as a lens, grating (e.g., Fresnel plate), diaphragm, iris or other suitable element is provided to regulate beam 14 parameters, e.g., its spot size 18 in the plane of measurement. Structure 20 consists of an underlayer 22 covered by a patterned layer 24. For reasons explained below, mechanism 16 has to be able to maintain spot 18 uniform and preferably larger than features 26 or at least larger than a relative feature size of features 26 making up a pattern 28 (only a portion shown) in patterned layer 24. Beam 14 is preferably incident on patterned layer 24 at near-normal incidence, but other angles of incidence can also be used.

A detector 30 is provided to detect a response light 32 in the form of reflected light from structure 20. Alternatively, a detector 34 is provided to detect response light 36 which is a transmitted light passing through structure 20 and emerging through underlayer 22. The method of the invention can be applied to reflection or transmission measurements or both. In cases where underlayer 22 is non-transparent to light beam 14 only reflection measurements can be performed. A computing unit 38 is connected to detector 30 (for transmission measurements computing unit 38 is also connected to detector 34) to analyze reflected light 32. Optical determination of a physical parameter of pattern 28 such as a thickness $t_p$ of features 26, or the index of refraction n or coefficient of extinction k of the material making up features 26 requires several steps and will be explained in reference to a separate optical structure 40 shown in FIGS. 2–3 and examined with apparatus 10.

Figure 2:
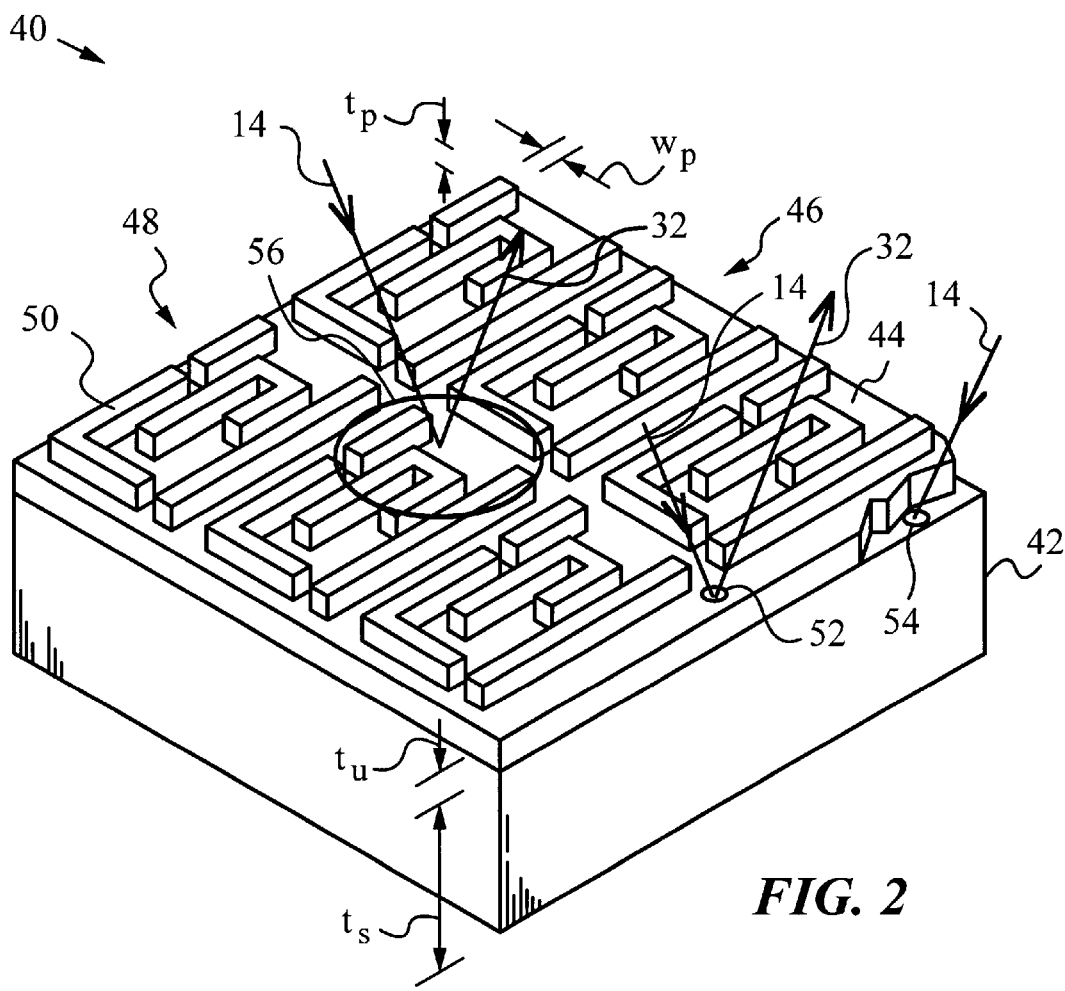
FIG. 2 is an isometric view of a structure made of a substrate with an underlayer carrying a pattern made up of features.
Figure 3:
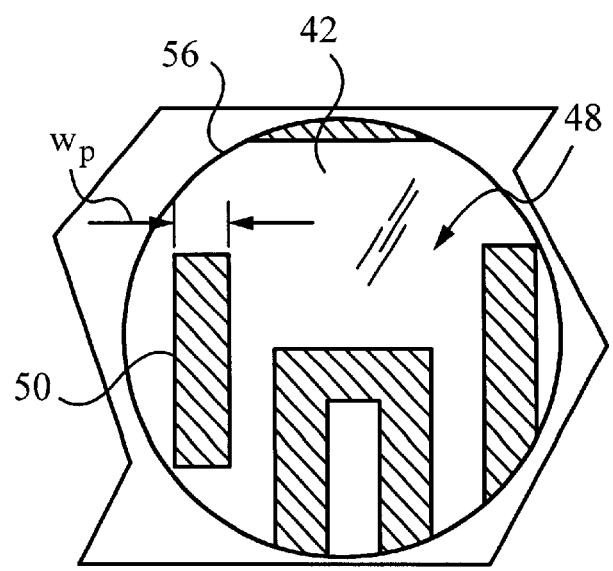
FIG. 3 is a top plan view illustrating a measurement according to the invention.

FIG. 2 illustrates optical structure 40 built up on a substrate 42. Substrate 42 carries an underlayer 44 and a patterning layer 46 in which there is a pattern 48 consisting of features 50. Pattern 48 can be produced in patterning layer 46 by photolithography or any other process. Features 50 are not all the same but in this case they all share the same width $w_p$ and thickness $t_p$, as indicated.

A reference parameter or several reference parameters of underlayer 44 should be determined first. These parameters can be known a priori, e.g., the can be predetermined obtained from literature, or obtained otherwise. Reference parameters can be optically determined by illuminating underlayer 44 with light beam 14. These reference parameters can include thickness $t_u$ of underlayer 44, its index of refraction $n_u$ or its extinction coefficient $k_u$. Preferably, all three of these reference parameters are determined.

In accordance with one approach, no portion of pattern 48 should be illuminated during this measurement. Thus, underlayer 44 can either be illuminated before deposition of patterning layer 46 or after patterning of layer 46 in a region where there are no features 50. This second option is shown in FIG. 2, where beam 14 is focused to a spot 52 on underlayer 44 away from features 50. Spot 52 is small in order to ensure that only underlayer 44 is being illuminated. Alternatively, the determination can be made by illuminating a large uniform area of optical structure 40 and extracting the reference parameters from the reflected (or transmitted) light. In accordance with yet another approach, structure 40 with pattern 48 thereon is illuminated and the reference parameters are obtained from a composite spectrum.

Any suitable optical technique can be used in determination of the reference parameters of underlayer 44. In fact, the reference parameters can be determined by non-optical techniques as well. Most preferably, however, a dispersion model, e.g., the Forouhi and Bloomer method described in U.S. Pat. No. 4,905,170, which is herein incorporated by reference, is employed in this determination.

The Forouhi-Bloomer technique is based on the following equations:

$$k(E) = \sum_{i=1}^{q} \frac{A_i(E - E_g)^2}{E^2 + B_i E + C_i},$$

$$n(E) = n(\infty) + \sum_{i=1}^{q} \frac{B_{0i} E + C_{0i}}{E^2 + B_i E + C_i}.$$

In these equations E is the photon energy, which is related to wavelength λ according to E=hc/λ, where h is Planck's constant and c is the speed of light in vacuum. $E_g$ is the bandgap energy or the minimum photon energy required for absorption, and A, B and C are parameters directly related to the electronic structure of the material of underlayer 44. The term n(∞) represents the value of index n(λ) as λ tends toward infinity. The quantities $B_0$ and $C_0$ are not independent parameters but depend on A, B, C and $E_g$. The equation for n(E) is derived from the equation for k(E) through the well-known Kramers-Kronig dispersion relation.

The Forouhi-Bloomer model incorporates the above equations into the Fresnel coefficients, along with a factor that depends on interface roughness σ between underlayer 44 and substrate 42 to generate a calculated or theoretical reflectance spectrum, $R_{th}$ or reflectance response of underlayer 44 in reflected beam 32. The quantity $R_{th}$ is then compared to the experimentally measured reflectance spectrum, R, or reflectance response of underlayer 44 over wavelength range Δλ to derive the values of $t_u$, $n_u$ and $k_u$. It should be noted, that underlayer 44 does not have to be measured on top of substrate 42. For example, underlayer 44 can be deposited on another substrate, e.g., silicon or silicon oxide, to the same thicknesses $t_u$ and examined thereon.

In the preferred embodiment a second reference physical parameter is obtained from patterning layer 46 prior to or after the patterning step (not shown). The second reference physical parameter is patterning layer 46 thickness $t_p$ (in this case corresponding to the thickness of pattern 48) its index of refraction $n_p$ or its extinction coefficient $k_p$. Again, preferably all three parameters are determined by an optical method, e.g., the Forouhi-Bloomer method described above. Alternatively, the values of second reference parameter(s) can be known a priori or obtained otherwise, as discussed in the case of reference parameterls) of underlayer 44.

Furthermore, in the preferred embodiment a third reference physical parameter of substrate 42 is also obtained by measurement or from a prior knowledge when underlayer 44 is transparent to at least a portion of wavelength range Δλ of light beam 14. These reference parameters preferably include thickness $t_s$, index $n_s$ and coefficient $k_s$ of substrate 42 and can also be determined by an optical method, e.g., the Forouhi-Bloomer technique, or another suitable method. When determining $t_s$, $n_s$ and $k_s$ optically, light beam 14 can be focused to a spot 54 on an area where substrate 42 is exposed, as shown in FIG. 2. Alternatively, this measurement can be performed before deposition of underlayer 44 on substrate 42.

Once reference parameters of underlayer 44, substrate 42 and patterning layer 46 are known, pattern 50 is examined. For this purpose the position of spot 56 of beam 14 is adjusted by adjustment mechanism 16, such that beam 14 illuminates pattern 48 and underlayer 44 over spot size 56. As better seen in FIG. 3, spot 56 covers a portion of pattern 48, in fact, one entire feature 50 and portions of other features 50 are illuminated by beam 14. It is important that spot 56 extend across or cover both underlayer 44 and at least a portion of pattern 58, e.g. at least a part of one feature 50.

Features 50 of pattern 48 have a minimum feature size, which in this case is their width $w_p$. In any given pattern one or more features or parts of all features have a minimum feature size. Due to the diffraction of light and the associated deleterious effects, it is preferable to select wavelength range Δλ of beam 14 such that the longest wavelength in range Δλ is smaller than this minimum feature size. In particular, the longest wavelength of range Δλ should be smaller than width $w_p$.

Most preferably, spot 56 covers a sufficiently large number of features 50 such that any deviations and irregularities in pattern 48 are averaged out. Specifically, spot 56 should be selected such that the measurement is not impaired by diffraction. Diffraction effects can present a problem when pattern 48 consists of multiple straight line features 50 acting as a diffraction grating.

Response light 32, i.e., light reflected from the portion of pattern 48 and underlayer 42 covered by spot 56, is detected by detector 30 and analyzed by computing unit 38 (see FIG. 1). In its analysis unit 38 breaks down reflected light 32 into its constituent light fractions. A feature light fraction as well as a background light fraction make up this reflected light 32. The background fraction contains underlayer light fraction as well as substrate light fraction (if underlayer 42 is transparent to light beam 14) and any other fractions due to reflection from other objects in the path of beams 14 and 32. Any physical parameter of pattern 48 or its features 50 is determined from these response light fractions and the reference physical parameters.

In the case of reflected light 32 the light fractions are reflected light fractions and are computed in accordance with the following equations:

$$R_{tot}(\lambda) = \sum_{i=1}^{N} R_i(\lambda) \cdot X_i; \sum_{i=1}^{N} X_i = 1$$

where $R_{tot}(\lambda)$ is the total reflected light in light 32 at a wavelength $\lambda$ contained in range $\Delta\lambda$, $R_i(\lambda)$ is the reflectance of the reflecting material, and $R_i(\lambda) \cdot X_i$ corresponds to reflected light fractions at wavelength $\lambda$. These light fractions correspond to the reflection sources, e.g., underlayer 44 and features 50. For example, $R_1(\lambda) \cdot X_1$ is due to first feature 50, $R_2(\lambda) \cdot X_2$ is due second feature 50, . . . and $R_N(\lambda) \cdot X_N$ is due to the N-th feature which can be simply underlayer 44. The sum is performed over all sources of light fractions, i.e., feature light fraction, underlayer light fraction, substrate light fraction and so on taking into account all fractions (or at least all significant light fractions) making up light 32. In this case parameter $X_i$ represents a geometrical fraction of the size of spot 56 occupied by the source of the reflected light fraction. For example, in the case of pattern 48, parameter $X_i$ represents the geometrical fraction of spot 56 which is taken up by features 50. For normalization reasons all geometrical fractions have to add up to 1, hence the second condition, which is a standard normalization condition.

In some embodiments pattern 48 and its area fraction (e.g., in the case of a line pattern) are known and in some cases pattern 48 is not well known and its area fraction has to be determined. In the latter case the geometrical fraction is determined from measurements and it is preferable, though not necessary, to have all the reference parameters from underlayer 44, substrate 42 and patterning layer 46.

Alternatively, response light from structure 40 can be a transmitted light (see FIG. 1). In that case transmitted light fractions are computed from:

$$T_{tot}(\lambda) = \sum_{i=1}^{N} T_i(\lambda) \cdot X_i; \sum_{i=1}^{N} X_i = 1$$

where $T_{tot}(\lambda)$ is the total transmitted light at wavelength $\lambda$ and $T_i(\lambda) \cdot X_i$ are the transmitted light fractions at wavelength $\lambda$, and $X_i$ are the geometrical fractions of the response due to a particular feature type. Otherwise, the computation performed by unit 38 is similar to the computation performed for the reflection case described above.

When features 50 are lines of the same width $w_p$ and the reflectivities or transmittances ($R_i$ or $T_i$) of all lines are the same, then the light fraction due to the lines can be used to measure width $w_p$ of the lines. That is because in this case the total response light fraction $RX_i$ due to illumined lines is proportional to the total width of these lines. In general, however, it will not be possible to determine geometrical dimensions of features 50 from response light fractions $R_iX_i$. However, for features with different reflectivities or transmissivities, it is possible to determine relative feature sizes base on the response light fractions from quotients of the response light fractions due to the individual features. This computation is straightforward and easily implemented by a person skilled in the art.

Figure 4A:
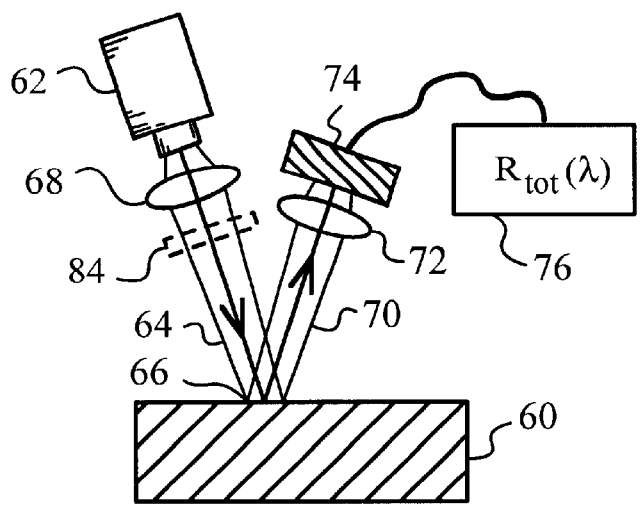
FIGS. 4A–4C are cross sectional side views illustrating an optical structure at three times when measurements may be performed.

A specific application of the method of invention in a reflectance type arrangement will be explained in reference to FIGS. 4A–C. FIG. 4A illustrates an underlayer 60 being examined to determine its reference parameters. A light source 62 provides a light beam 64 over wavelength range $\Delta\lambda$. A lens 68 is used to guide and focus light beam 64. Response light in the form of reflected beam 70 is focused by a lens 72 on a detector 74. Detector 74 is connected to a signal processor 76 which analyzes the signal from detector 74 and determines the total reflectivity $Rtot(\lambda)$ as a function of wavelength $\lambda$ over wavelength range $\Delta\lambda$. In this case total reflectivity $R_{tot}(\lambda)$ contains only one light fraction $R_{tot}(\lambda) = R_1(\lambda) \cdot X_1$; $X_1=1$; this is the fraction due to underlayer 60. From this unit 76 determines underlayer reference parameters $t_u$, $n_u$ and $k_u$ preferably using the Forouhi-Bloomer technique.

Figure 4B:
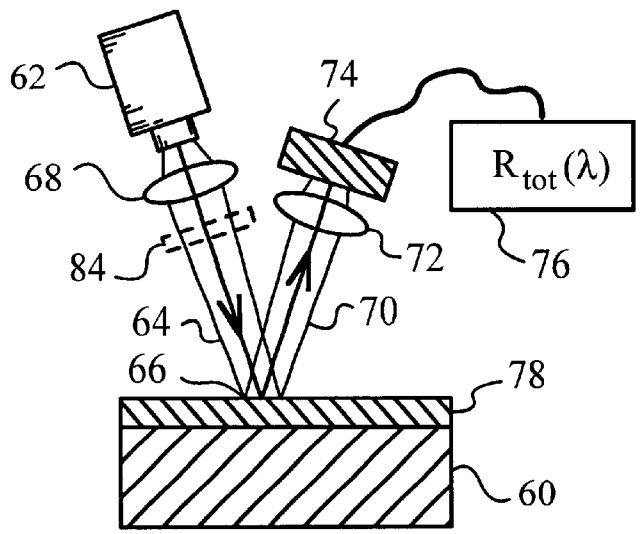

As shown in FIG. 4B, after deposition of patterning layer 78 the measurement is repeated. Now, detector 74 receives reflected beam 70 in which total reflectance $R_{tot}(\lambda)$ contains a light fraction $R_1(\lambda) \cdot X_1$ due to underlayer 60 and a light fraction $R_2(\lambda) \cdot X_2$ due to patterning layer 78. From this information unit 76 determines second reference parameters $t_p$, $n_p$ and $k_p$. Of course, in the case of non-transparent patterning layer 78 no light fraction due to underlayer 60 is received and $R_{tot}(\lambda)$ contains light fraction $R_2(\lambda) \cdot X_2$ due to patterning layer 78 only. In either case a person of average skill in the art will know how to determine reference parameters $t_p$, $n_p$ and $k_p$ and will preferably employ the Forouhi-Bloomer technique.

Figure 4C:
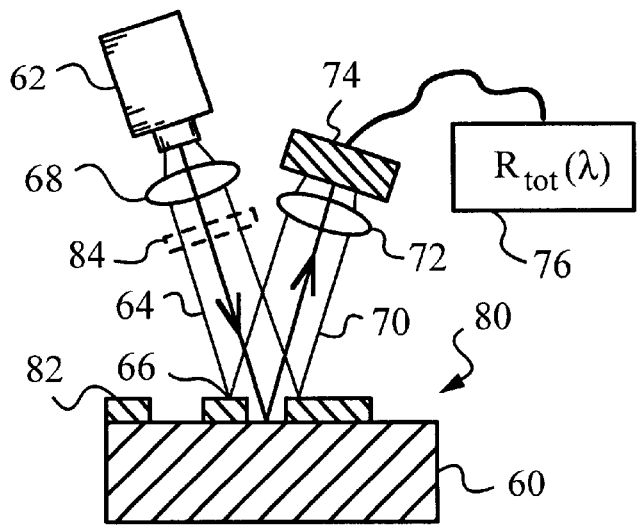

After a pattern 80 of features 82 is produced in patterning layer 78 by a photolithographic technique the measurement is repeated, as shown in FIG. 4C. Spot 66 is positioned in accordance with the above-discussed guidelines to extend over underlayer 60 and at least a portion of pattern 80. Reflected beam 70 is analyzed by unit 76. Total reflectance $R_{tot}(\lambda)$ signal contains light fraction $R_1(\lambda) \cdot X_1$ due to underlayer 60 and light fraction $R_2(\lambda) \cdot X_2$ due to patterning layer 78 and specifically due to pattern 80.

The physical parameters of features 82 of pattern 80 can now be determined, e.g., using the Forouhi-Bloomer method in the analysis of $R_{tot}(\lambda)$. Alternatively, if all reference parameters are known, including $t_p$, $n_p$ and $k_p$, light fraction $R_2(\lambda) \cdot X_2$ can be the unknown measured by unit 76. This fraction can be used to verify whether pattern 80 is complete.

An optional polarization control element 84, e.g., a polarizer, can be inserted if a particular polarization or combination of polarizations, or even the phase relationship between the polarizations contained in beam 64 are to be controlled. Alternatively, element 84 can be placed in the path of reflected beam 70 if polarization of reflected beam 70 only is to be analyzed. A person of average skill in the art will recognize that these are ellipsometric-type measurements which are well-known in the art and will be able to adapt them to the present method.

Figure 5:
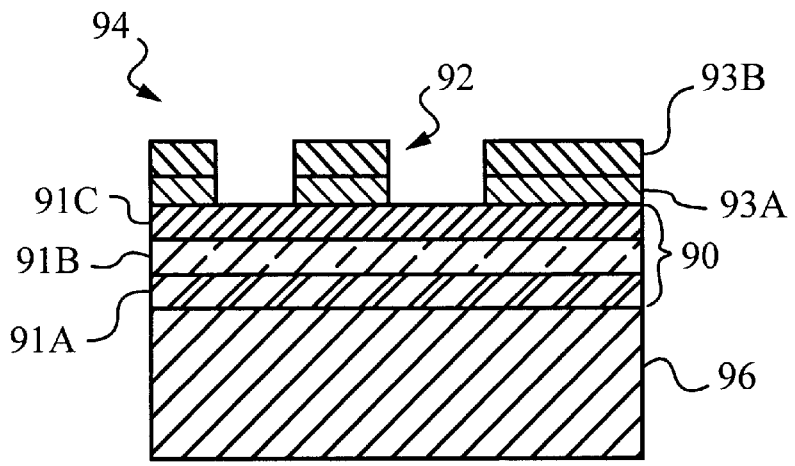
FIG. 5 shows a structure having a number of underlayer sub-layers and feature sub-layers.

The features making up any particular pattern can be very simple, e.g., straight lines, or they can be more complicated. Furthermore, the features do not all have to be the same and they can be made of several feature sub-layers stacked on top of each other. An embodiment in which both an underlayer 90 and features 92 of a pattern 94 are made of underlayer sub-layers 91A, 91B, 91C and feature sub-layers 93A, 93B respectively is shown in FIG. 5. This structure also has a substrate 96.

In this case it is only necessary to analyze the physical parameters or sub-layers which contribute to the total reflectance or transmittance, depending on the measurement chosen. For example, when sub-layer 91B is opaque in wavelength range $\Delta\lambda$ a measurement for obtaining reference parameters is only necessary for substrate with layers 91B and 91C and from final structure with feature sub-layers 93A and 93B. The properties of feature sub-layer 91A and substrate 96 do not contribute to the total reflectance and can hence be disregarded. A person of average skill in the art will recognize that any layer, sub-layer or portion of the layer not contributing to $R_{tot}(\lambda)$ or $T_{tot}(\lambda)$ can be treated in a similar manner.

Figure 6:
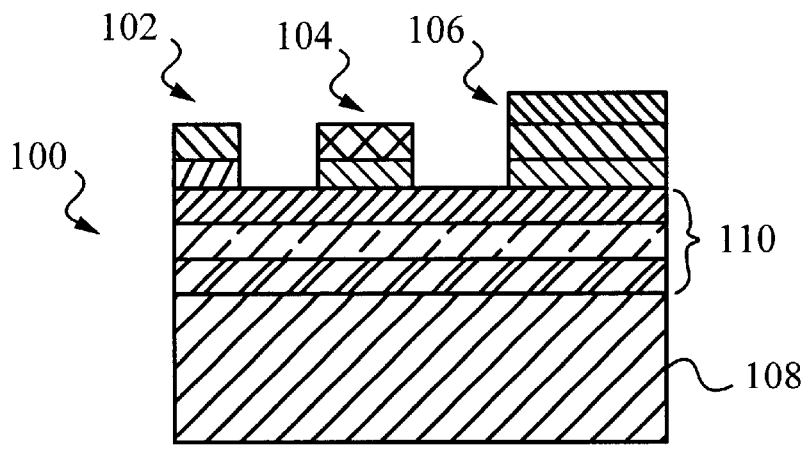
FIG. 6 shows a complex structure with a pattern made of features with differing numbers of sub-layers.

A more complicated structure 100 is illustrated in FIG. 6. Structure 100 has different regions 102, 104, 106 where features are made of different sub-layers. Structure 100 has a substrate 108 and an underlayer 110 composed of sub-layers. In this case all three regions 102, 104 and 106 can be measured and analyzed at the same time in accordance with the method of the invention.

Figure 7:
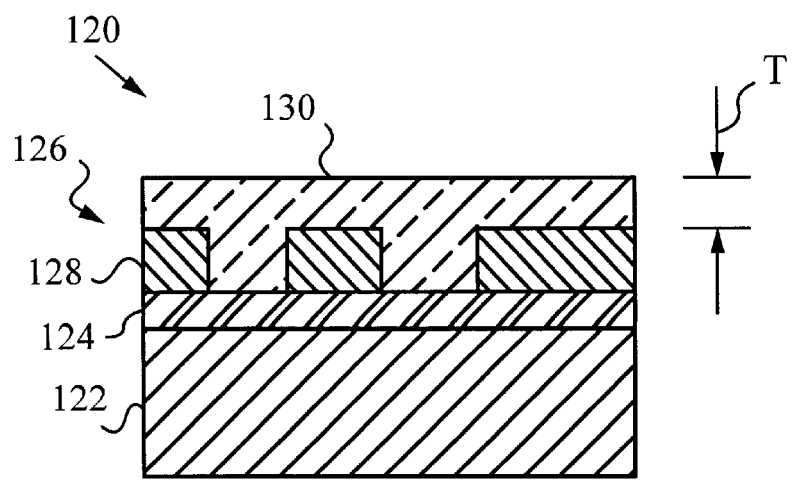
FIG. 7 shows a structure in which the features of the pattern are covered by a top coat.

Yet another structure 120 made of a substrate 122, underlayer 124, pattern 126 of features 128 is illustrated in FIG. 7. In this embodiment pattern 126 is embedded. Specifically, pattern 126 is covered or coated by a top layer 130. Preferably, all reference parameters for the components of structure 120 were determined during its making in the manner described above with reference to FIGS. 4A–C. The physical parameters of top layer 130 can be found after all light fractions in the response signal, e.g., the reflected signal, are determined. Specifically, thickness T of top layer 130 can be monitored by the method of the invention, e.g., to monitor the fabrication or processing, e.g., Chemical Mechanical Processing (CMP) of top layer 130. Typical prior art pattern-recognition software fail to locate certain small feature after CMP. In this case, the method of the invention is specifically useful because a large spot size of light can be used to measured films inside small features without knowing the accurate location of the small features.

Figure 8:
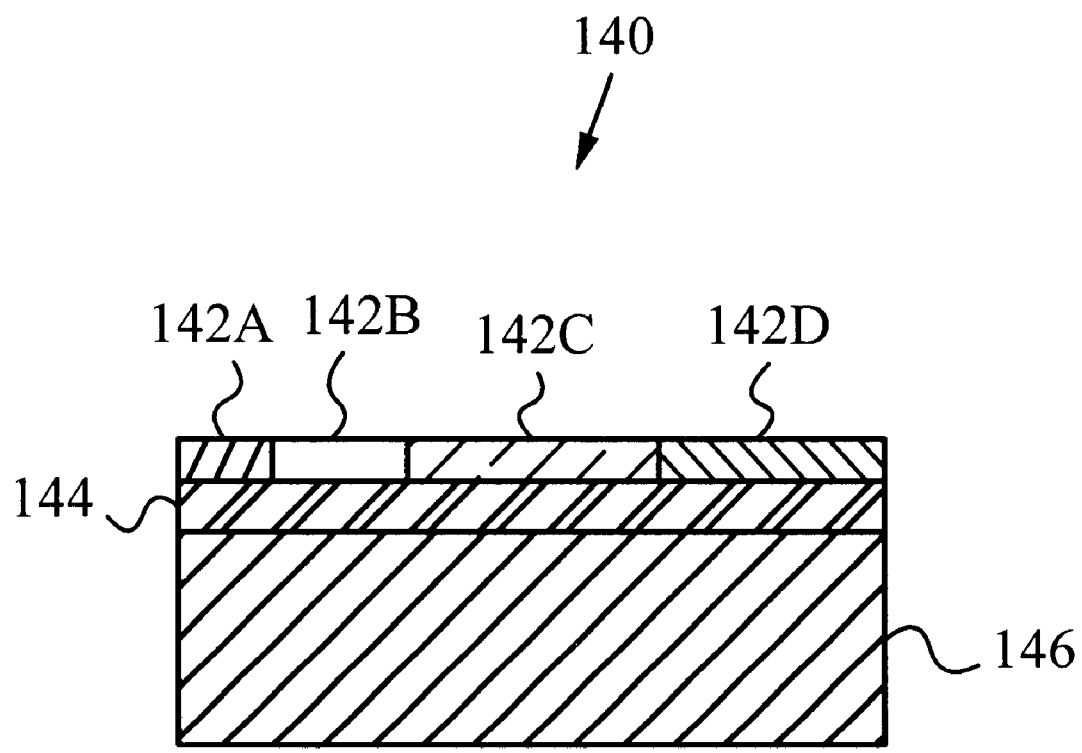
FIG. 8 shows a structure without a top coat.

The method of the invention is not limited to layered structures; any patterns of features on any backgrounds or underlayers can be examined. For example, a structure 140 as shown in FIG. 8 can be analyzed by the method of the invention. In this case, features 142A, 142B, 142C and 142D are adjacent each other. They are deposited on an underlayer 144 which is coated on a substrate 146. In this case the light beam has to be focussed such that the spot extends over at least two of features 142, e.g., features 142B and 142C.

It will be clear to one skilled in the art that the above embodiment may be altered in many ways without departing from the scope of the invention. Accordingly, the scope of the invention should be determined by the following claims and their legal equivalents.

What is claimed is:

1. A method for optically determining a physical parameter of a pattern having features and being disposed on an underlayer, said method comprising the following steps:

a) illuminating said underlayer with a light beam;

b) receiving a reference light from said underlayer;

c) determining a reference physical parameter of said underlayer from said reference light;

d) illuminating said underlayer and at least a portion of said pattern with said light beam;

e) receiving a response light from said portion of said pattern and from said underlayer;

f) determining response light fractions comprising an underlayer light fraction and a feature light fraction;

g) determining said physical parameter of said pattern from said response light fractions and said reference physical parameter.

2. The method of claim 1, further comprising the steps of:

a) disposing a patterning layer on said underlayer;

b) illuminating said patterning layer and said underlayer with said light beam;

c) receiving a second reference light from said underlayer and said patterning layer;

d) determining a second reference physical parameter from said second reference light;

e) producing said pattern in said patterning layer;

f) using said second reference physical parameter in determining said physical parameter of said pattern.

3. The method of claim 1, further comprising the step of selecting a wavelength range $\Delta\lambda$ for said light beam.

4. The method of claim 3, wherein said features have a minimum feature size and a longest wavelength in said wavelength range $\Delta\lambda$ is selected to be substantially smaller than said minimum feature size.

5. The method of claim 3, wherein said wavelength range $\Delta\lambda$ comprises wavelengths ranging from ultra-violet to infra-red.

6. The method of claim 1, wherein said response light is a reflected light and said response light fractions are reflected light fractions computed from the following equations:

$$R_{tot}(\lambda) = \sum_{i=1}^{N} R_i(\lambda) \cdot X_i; \sum_{i=1}^{N} X_i = 1$$

where $R_{tot}(\lambda)$ is said reflected light at a wavelength $\lambda$ selected from a wavelength range $\Delta\lambda$, and $R_i(\lambda) \cdot X_i$ correspond to said reflected light fractions.

7. The method of claim 1, wherein said response light is a transmitted light and said response light fractions are transmitted light fractions computed from the following equations:

$$T_{tot}(\lambda) = \sum_{i=1}^{N} T_i(\lambda) \cdot X_i; \sum_{i=1}^{N} X_i = 1$$

where $T_{tot}(\lambda)$ is said transmitted light at a wavelength $\lambda$ selected from a wavelength range $\Delta\lambda$, and $T_i(\lambda) \cdot X_i$ correspond to said transmitted light fractions.

8. The method of claim 1, wherein said underlayer is disposed on a substrate and said method further comprises the following steps:

a) illuminating said substrate with said light beam;

b) receiving a second reference light from said substrate;

c) determining a second reference physical parameter from said second reference light;

d) using said second reference physical parameter in determining said physical parameter of said pattern.

9. The method of claim 1, wherein said features comprise a number of feature sub-layers.

10. The method of claim 1, wherein said underlayer comprises a number of underlayer sub-layers.

11. The method of claim 1, wherein said pattern is produced by a photolithographic technique.

12. The method of claim 1, wherein said physical parameter is selected from the group consisting of feature width, relative feature size, feature thickness, index of refraction n and extinction coefficient k.

13. The method of claim 1, wherein said reference physical parameter is selected from the group consisting of underlayer thickness, index of refraction n and extinction coefficient k.

14. An apparatus for optically determining a physical parameter of a pattern having features and being disposed on an underlayer, said underlayer having a reference physical parameter, said apparatus comprising:
   a) an illumination source for providing a light beam;
   b) a beam adjustment means for adjusting said light beam such that said underlayer and at least a portion of said pattern are illuminated;
   c) a detector for receiving a response light from said underlayer and from said portion of said pattern; and
   d) a computing unit in communication with said detector for determining response light fractions comprising an underlayer light fraction and a feature light fraction, and for determining said physical parameter of said pattern from said response light fractions and said reference physical parameter.

15. A method for optically determining reflected light fractions produced by a structure having an underlayer carrying a pattern having features, said method comprising the following steps:
   a) determining a reference physical parameter of said underlayer;
   b) determining a relative feature size of said features;
   c) illuminating said structure with a light beam having a spot extending over at least a portion of said pattern and said underlayer;
   d) receiving reflected light from said portion of said pattern and said structure;
   e) determining reflected light fractions comprising an underlayer light fraction and a feature light fraction in said reflected light from the following equations:

$$R_{tot}(\lambda) = \sum_{i=1}^{N} R_i(\lambda) \cdot X_i; \quad \sum_{i=1}^{N} X_i = 1$$

where $R_{tot}(\lambda)$ is said reflected light at a wavelength $\lambda$ selected from a wavelength range $\Delta\lambda$, and $R_i(\lambda) \cdot X_i$ correspond to said reflected light fractions.

16. The method of claim 15, further comprising the step of determining a physical parameter of said pattern from said reflected light fractions and said reference physical parameter.

17. The method of claim 16, wherein said physical parameter is selected from the group consisting of feature width, relative feature size, feature thickness, index of refraction n and extinction coefficient k.

18. A method for optically determining transmitted light fractions produced by a structure having an underlayer carrying a pattern having features, said method comprising the following steps:
   a) determining a reference physical parameter of said underlayer;
   b) determining a relative feature size of said features;
   c) illuminating said structure with a light beam having a spot extending over at least a portion of said pattern and said underlayer;
   d) receiving transmitted light from said portion of said pattern and said structure;
   e) determining transmitted light fractions comprising an underlayer light fraction and a feature light fraction in said transmitted light from the following equations:

$$T_{tot}(\lambda) = \sum_{i=1}^{N} T_i(\lambda) \cdot X_i; \quad \sum_{i=1}^{N} X_i = 1$$

where $T_{tot}(\lambda)$ is said transmitted light at a wavelength $\lambda$ selected from a wavelength range $\Delta\lambda$, and $T_i(\lambda) \cdot X_i$ correspond to said transmitted light fractions.

19. The method of claim 18, further comprising the step of determining a physical parameter of said pattern from said transmitted light fractions and said reference physical parameter.

20. The method of claim 19, wherein said physical parameter is selected from the group consisting of feature width, relative feature size, feature thickness, index of refraction n and extinction coefficient k.

21. A method for optically determining reflected light fractions produced by a structure having an underlayer carrying a pattern having features, said method comprising the following steps:
   a) determining a reference physical parameter of said underlayer;
   b) determining a relative feature size of said features;
   c) illuminating said structure with a light beam having a spot extending over at least two of said features;
   d) receiving reflected light from said at least two features;
   e) determining reflected light fractions comprising an underlayer light fraction and a feature light fraction in said reflected light from the following equations:

$$R_{tot}(\lambda) = \sum_{i=1}^{N} R_i(\lambda) \cdot X_i; \quad \sum_{i=1}^{N} X_i = 1$$

where $R_{tot}(\lambda)$ is said reflected light at a wavelength $\lambda$ selected from a wavelength range $\Delta\lambda$, and $R_i(\lambda) \cdot X_i$ correspond to said reflected light fractions.

22. The method of claim 21, further comprising the step of determining a physical parameter of said pattern from said reflected light fractions and said reference physical parameter.

23. The method of claim 22, wherein said physical parameter is selected from the group consisting of feature width, relative feature size, feature thickness, index of refraction n and extinction coefficient k.

24. A method for optically determining transmitted light fractions produced by a structure having an underlayer carrying a pattern having features, said method comprising the following steps:

a) determining a reference physical parameter of said underlayer;

b) determining a relative feature size of said features;

c) illuminating said structure with a light beam having a spot extending over at least two of said features;

d) receiving transmitted light from said at least two features;

e) determining transmitted light fractions comprising an underlayer light fraction and a feature light fraction in said transmitted light from the following equations:

$$T_{tot}(\lambda) = \sum_{i=1}^{N} T_i(\lambda) \cdot X_i; \quad \sum_{i=1}^{N} X_i = 1$$

where $T_{tot}(\lambda)$ is said transmitted light at a wavelength $\lambda$ selected from a wavelength range $\Delta\lambda$, and $T_i(\lambda) \cdot X_i$ correspond to said transmitted light fractions.

25. The method of claim 24, further comprising the step of determining a physical parameter of said pattern from said transmitted light fractions and said reference physical parameter.

26. The method of claim 25, wherein said physical parameter is selected from the group consisting of feature width, relative feature size, feature thickness, index of refraction n and extinction coefficient k.

* * * * *

UNITED STATES PATENT AND TRADEMARK OFFICE
CERTIFICATE OF CORRECTION

PATENT NO.    : 6,327,035 B1
DATED         : December 4, 2001
INVENTOR(S)   : Guoguang Li et al.

It is certified that error appears in the above-identified patent and that said Letters Patent is hereby corrected as shown below:

<u>Title page,</u>
Item [73], Assignee, should be -- n & k Technology, Inc. -- not "NSH Technology, Inc."

Signed and Sealed this

Fourth Day of June, 2002

Attest:

JAMES E. ROGAN
Attesting Officer          *Director of the United States Patent and Trademark Office*